(12) United States Patent
Tian et al.

(10) Patent No.: US 11,403,442 B2
(45) Date of Patent: Aug. 2, 2022

(54) DIGITAL TWIN MONITORING SYSTEM OF TETHERED BALLOON

(71) Applicant: 38th RESEARCH INSTITUTE, CHINA ELECTRONICS TECHNOLOGY GROUP CORPORATION, Hefei (CN)

(72) Inventors: Fujun Tian, Hefei (CN); Xingyu Chen, Hefei (CN); Liangxi Chen, Hefei (CN); Yanlong Zhang, Hefei (CN); Yixiong Wei, Hefei (CN); Hongqiao Zhou, Hefei (CN); Lei Guo, Hefei (CN); Jinwen Zhou, Hefei (CN); Hongqi Zhang, Hefei (CN); Shanshan Zha, Hefei (CN)

(73) Assignee: 38TH RESEARCH INSTITUTE, CHINA ELECTRONICS TECHNOLOGY GROUP CORPORATION, Hefei (CN)

( * ) Notice: Subject to any disclaimer, the term of this patent is extended or adjusted under 35 U.S.C. 154(b) by 0 days.

(21) Appl. No.: 17/545,169

(22) Filed: Dec. 8, 2021

(65) Prior Publication Data

US 2022/0100927 A1 Mar. 31, 2022

Related U.S. Application Data

(63) Continuation of application No. PCT/CN2020/090204, filed on May 14, 2020.

(30) Foreign Application Priority Data

Apr. 23, 2020 (CN) .......................... 202010328764.9

(51) Int. Cl.
*B64B 1/50* (2006.01)
*G06F 30/20* (2020.01)
(Continued)

(52) U.S. Cl.
CPC ................ *G06F 30/20* (2020.01); *B64B 1/50* (2013.01); *B64B 1/62* (2013.01); *G05B 17/02* (2013.01); *G05B 19/042* (2013.01)

(58) Field of Classification Search
CPC .......... B64B 1/50; G05B 17/02; G05B 19/042
See application file for complete search history.

(56) References Cited

U.S. PATENT DOCUMENTS

2008/0087762 A1* 4/2008 Holloman ............. B64C 1/0009
244/30

FOREIGN PATENT DOCUMENTS

| CN | 203005742 U | 6/2013 |
| CN | 206291896 U | 6/2017 |

(Continued)

*Primary Examiner* — Tye William Abell (57) ABSTRACT

Disclosed is a digital twin tethered balloon system; key running state data of a tethered balloon is collected through an Internet of Things of a tethered balloon system; the key running state data of the tethered balloon is transmitted to a twin data service center; the twin data service center receives, analyzes and stores the data and forwards the data to a tethered balloon digital twin system; the tethered balloon digital twin system simulates a pose of a tethered balloon body and the movement of a ground tethering facility; and the tethered balloon monitoring service provides running state monitoring, quality problem tracking, fault prediction and early warning, automatic control and other services.

20 Claims, 4 Drawing Sheets
(4 of 4 Drawing Sheet(s) Filed in Color)

(51) Int. Cl.
*B64B 1/62* (2006.01)
*G05B 17/02* (2006.01)
*G05B 19/042* (2006.01)

(56) References Cited

FOREIGN PATENT DOCUMENTS

| | | |
|---|---|---|
| CN | 107416172 A | 12/2017 |
| CN | 107579767 A | 1/2018 |
| CN | 207580143 U | 7/2018 |
| CN | 109116751 A | 1/2019 |
| CN | 109571476 A | 4/2019 |
| CN | 109819233 A | 5/2019 |
| CN | 110816885 A | 2/2020 |
| CN | 110989605 A | 4/2020 |
| JP | 2011171803 A | 9/2011 |

* cited by examiner

DIGITAL TWIN MONITORING SYSTEM OF TETHERED BALLOON

CROSS-REFERENCE TO RELATED APPLICATIONS

This application is a continuation of International Patent Application No. PCT/CN2020/090204, filed on May 14, 2020, which claims the benefit of priority from Chinese Patent Application No. 202010328764.9, filed on Apr. 23, 2020. The content of the aforementioned application, including any intervening amendments thereto, is incorporated herein by reference in its entirety.

TECHNICAL FIELD

The present invention relates to the technical field of digital twin, and particularly relates to a digital twin monitoring system of a tethered balloon.

BACKGROUND OF THE PRESENT INVENTION

A tethered balloon system is mainly used for low-altitude and ultra-low-altitude early warning, sea alert and reconnaissance and surveillance for deep areas of enemy borders, and is a good supplement to airborne early warning aircraft and ground radar networks, as well as a comprehensive information system with radar as a mission system. The tethered balloon system is widely applied to military and civil fields such as early warning detection, communication relay, electronic interference, disaster prevention and mitigation, public safety, etc. The tethered balloon system is used for raising mission loads such as radar to an altitude of about 3000 m to perform combat mission such as alert of low-altitude and ultra-low-altitude targets. The tethered balloon system has the characteristics of long hang time, large payload capacity, convenient deployment, low cost and the like. The tethered balloon system has been widely used in the military and civil fields, and plays an important role in guaranteeing the national defense security and public security.

With the gradual increase in the number of products and the aging of tethered balloon equipment, the safety problems in a running process of the tethered balloon system are gradually increased. How to ensure the running safety of the tethered balloon system has become an urgent problem to be solved. At present, systems for ensuring the running safety of the tethered balloon system mainly include a tethered balloon measurement and control system and a remote video monitoring system. The tethered balloon measurement and control system includes an on-balloon measurement and control part and an off-balloon monitoring part. The on-balloon measurement and control part is used for data collection. The off-balloon monitoring part is used for comprehensive display of information. The remote video monitoring system remotely monitors a working state of the tethered balloon through several fixed cameras.

However, the above two systems both have the technical problem of weak interaction means.

SUMMARY OF THE PRESENT INVENTION (I) Technical Problem to be Solved

In view of the disadvantages of the prior art, the present invention provides a digital twin monitoring system of a tethered balloon, which solves the technical problem of weak interaction means in the existing tethered balloon monitoring system.

(II) Technical Solutions

In order to achieve the above purpose, the present invention is implemented through the following technical solutions:

The present invention provides a digital twin tethered balloon system, which includes:

a physical tethered balloon system, wherein the physical tethered balloon system is an objective physical entity of the tethered balloon system and includes a balloon body, a subsystem on-balloon device, a tethering rope, a ground tethering facility, a ground control device, an Internet of Things of a tethered balloon system and a tethered balloon on-balloon executing mechanism; the Internet of Things of the tethered balloon system is used to collect key running state data of a tethered balloon; and the on-balloon executing mechanism is used to receive and execute a control instruction of the tethered balloon digital twin system;

a twin data service center, wherein the twin data service center receives the key running state data of the tethered balloon and analyzes, stores and forwards the key running state data of the tethered balloon;

a tethered balloon digital twin system, wherein the tethered balloon digital twin system is a digital mirror image of the physical tethered balloon system, and drives a twin model to realize the pose simulation of a tethered balloon body and movement simulation of the ground tethering facility through the key running state data of the tethered balloon forwarded by the twin data service center; and a tethered balloon monitoring service system, wherein the tethered balloon monitoring service system analyzes, processes and mines the key running state data of the twin data service center to realize the monitoring of a working state of the tethered balloon system, all-round multi-view monitoring, tracing of major safety problems and automatic control of the tethered balloon system.

Preferably, the twin data service center forwards the key running state data of the tethered balloon to the tethered balloon digital twin system in a following way: a user datagram protocol.

Preferably, the Internet of Things of the tethered balloon is composed of sensors deployed on the tethered balloon system, including an air pressure measurement unit, a Beidou positioning system, a three-dimensional attitude and orientation reference system, a wind speed and wind direction indicator, a tension sensor and a temperature transmitter.

Preferably, the pose simulation of the tethered balloon body includes:

a local coordinate system position of the balloon body is set according to longitude, latitude and altitude information of the tethered balloon system to realize the position change of the tethered balloon body; and an Euler angle of the local coordinate system of the balloon body is set according to a pitch angle, a rolling angle and a course of the balloon body to realize the pose change of the tethered balloon body.

The movement simulation of the ground tethering facility includes:

an Euler angle of the local coordinate system of the ground tethering facility is set according to orientation data of a protection cabin to realize the rotation change of the ground tethering facility.

Preferably, the twin model mainly includes a balloon body digital twin model, a tethering rope digital twin model, a ground tethering facility digital twin model and a ground control center digital twin model.

Preferably, a building process of the balloon body digital twin model includes: creating a balloon body empty object, setting a local coordinate system position of the balloon body empty object as a gravity core coordinate of the balloon body, and adding a on-balloon device model to a balloon body node, so that the pose change of the balloon body can rotate around the gravity core of the balloon body.

A building process of the ground tethering facility digital twin model includes: creating a ground tethering facility empty body, setting a local coordinate system position of the ground tethering facility empty object as an origin of a global coordinate system, and adding a model rotating with the ground tethering facility to the ground tethering facility object node, so that the ground tethering facility can rotate around the center of a tethering tower.

Preferably, the key running state data of the tethered balloon includes: balloon parameter data, power supply data, working state data, fault data and emergency data.

The balloon parameter data includes pressure of each airbag, airbag temperature, valve temperature, outer atmospheric temperature and humidity, wind speed and wind direction, balloon fullness, balloon attitude and course, balloon altitude, balloon orientation and tethering rope on-balloon tensile force.

Equipment control data includes pressure remote control, pressure automatic control, fan control, valve control, valve heating control, anti-collision light control, tear pair control and responder control.

The working state data includes a working state of a system power supply, a running state of the executing mechanism and a working state of a protection room tethering device.

The fault data includes a fault state of an on-balloon control system and a fault state of an on-balloon power supply system.

Preferably, viewing angles provided by the all-round multi-view monitoring include a viewing angle of ground personnel, an on-balloon free-to-follow viewing angle and a plurality of fixed viewing angles.

Preferably, the tracing of major safety problems includes: when major safety problems occur, according to the historical running twin data of the tethered balloon, the tethered balloon digital twin system is used to realize the reappearing of a historical running process and scene of the tethered balloon system to find causes of the major safety problems.

Preferably, the automatic control of the tethered balloon includes: the pressure of each airbag body of the tethered balloon is automatically controlled through a fan and a valve; and when the pressure is excessively high, the valve is opened to release the air, and when the pressure is excessively low, the fan is started for inflation.

(III) Beneficial Effects

The present invention provides the tethered balloon digital twin monitoring system. Compared with the prior art, the present invention has the following beneficial effects:

In the present invention, key running state data of the tethered balloon is collected through the Internet of Things of the tethered balloon system; the key running state data of the tethered balloon is transmitted to the twin data service center; the twin data service center receives, analyzes and stores the data and forwards the data to the tethered balloon digital twin system; the tethered balloon digital twin system performs simulation and comprehensive visualization on the pose of the tethered balloon body and the ground tethering facility; the tethered balloon monitoring service provides running state monitoring, quality problem tracking, fault prediction and early warning, automatic control and other services; and the present invention realizes the deep integration of the physical space and the digital space of the tethered balloon system, which can monitor the tethered balloon system, and is high in visualization degree and good in interaction means, thereby realizing the all-round multi-view monitoring for the tethered balloon, tracing of major safety problems, and fault diagnosis and early warning, and ensuring the running safety of the tethered balloon system.

BRIEF DESCRIPTION OF THE DRAWINGS

To more clearly describe the technical solutions in the embodiments of the present invention or in the prior art, the drawings required to be used in the description of the embodiments or the prior art will be simply presented below. Apparently, the drawings in the following description are merely some embodiments of the present invention, and for those ordinary skilled in the art, other drawings can also be obtained according to these drawings without contributing creative labor.

The patent or application file contains at least one drawing executed in color. Copies of this patent or patent application publication with color drawing(s) will be provided by the Office upon request and payment of the necessary fee.

DETAILED DESCRIPTION OF THE PRESENT INVENTION

To make purposes, technical solutions and advantages of the embodiments of the present invention more clear, the technical solutions in the embodiments of the present invention will be clearly and fully described. Apparently, the described embodiments are merely part of the embodiments of the present invention, not all of the embodiments. Based on the embodiments in the present invention, all other embodiments obtained by those ordinary skilled in the art without contributing creative labor will belong to the protection scope of the present invention.

Embodiments of the present invention provide a tethered balloon digital twin monitoring system, which solves the technical problems of the existing tethered balloon monitoring system that the visualization degree is low and interaction means is weak, realizes the deep integration of a physical space and a digital space of the tethered balloon system, can monitor the tethered balloon system, and is high in visualization degree and good in interaction means, thereby realizing the all-round multi-view monitoring of the tethered balloon, tracing of major safety problems and fault diagnosis and early warning, and ensuring the running safety of the tethered balloon system.

Embodiments of the present invention adopt the technical solutions to solve the above technical problems with a general thought as follows:

The tethered balloon system has been widely used in the military and civil fields, and plays an important role in guaranteeing the national defense security and public security. With the increase in number of product armed forces, the running safety problem of the tethered balloon system becomes apparent gradually. Although a large number of measures have been adopted to ensure the running safety of the tethered balloon system, including improving the safety design of products, formulating strict safety guarantee measures, adopting video monitoring devices to perform safety surveillance on key parts, major safety accidents still occur. Therefore, how to effectively ensure the running safety of the tethered balloon system is an urgent problem to be solved at present. At present, systems for ensuring the running safety of the tethered balloon system mainly include a tethered balloon measurement and control system and a remote video monitoring system. However, the above two systems have the problems such as poor digital space virtual-real mapping, low visualization degree, poor monitoring, etc.

With the development of the tethered balloon system, the state analysis work of the device becomes more automatic and intelligent. On the one hand, with the development of sensing technologies, balloon parameters, working state information and fault information may be automatically collected. On the other hand, the development of digital twin and artificial intelligence technology makes the remote real-time processing, analysis and prediction of data possible. Therefore, an embodiment of the present invention provides a digital twin tethered balloon system to monitor a working state of the tethered balloon system, trace major safety problems, perform diagnosis and early warning on faults and optimize the tethered balloon system.

In order to better understand the above technical solutions, the above technical solutions are described below in detail in combination with accompanying drawings and embodiments.

An embodiment of the present invention provides a digital twin tethered balloon system, which includes a physical tethered balloon system, a twin data service center, a tethered balloon digital twin system and a tethered balloon monitoring service system, wherein the physical tethered balloon system is an objective physical entity of the tethered balloon system and includes a balloon body, a subsystem on-balloon device, a tethering rope, a ground tethering facility, a ground control device, an Internet of Things of the tethered balloon system and a tethered balloon on-balloon executing mechanism; the Internet of Things of the tethered balloon system is used to collect key running state data of a tethered balloon; and the on-balloon executing mechanism is used to receive and execute a control instruction of the tethered balloon digital twin system.

The twin data service center receives the key running state data of the tethered balloon and analyzes, stores and forwards the key running state data of the tethered balloon;

The tethered balloon digital twin system is a digital mirror image of the physical tethered balloon system, and drives a twin model to realize position simulation of a tethered balloon body and movement simulation of the ground tethering facility through the key running state data of the tethered balloon forwarded by the twin data service center and the comprehensive visualization of various data;

The tethered balloon monitoring service system realizes the monitoring of a working state of the tethered balloon system, all-round multi-view monitoring, tracing of major safety problems and automatic control of the tethered balloon system through the key running state data of the tethered balloon forwarded by the twin data service center.

The embodiment of the present invention realizes the deep integration of a physical space and a digital space of the tethered balloon system, which can monitor the tethered balloon system, and is high in visualization degree and good in interaction means, thereby realizing the all-round multi-view monitoring of the tethered balloon, tracing of major safety problems and fault diagnosis and early warning, and ensuring the running safety of the tethered balloon system.

All components of the digital twin tethered balloon system are described in detail below.

Figure 1:
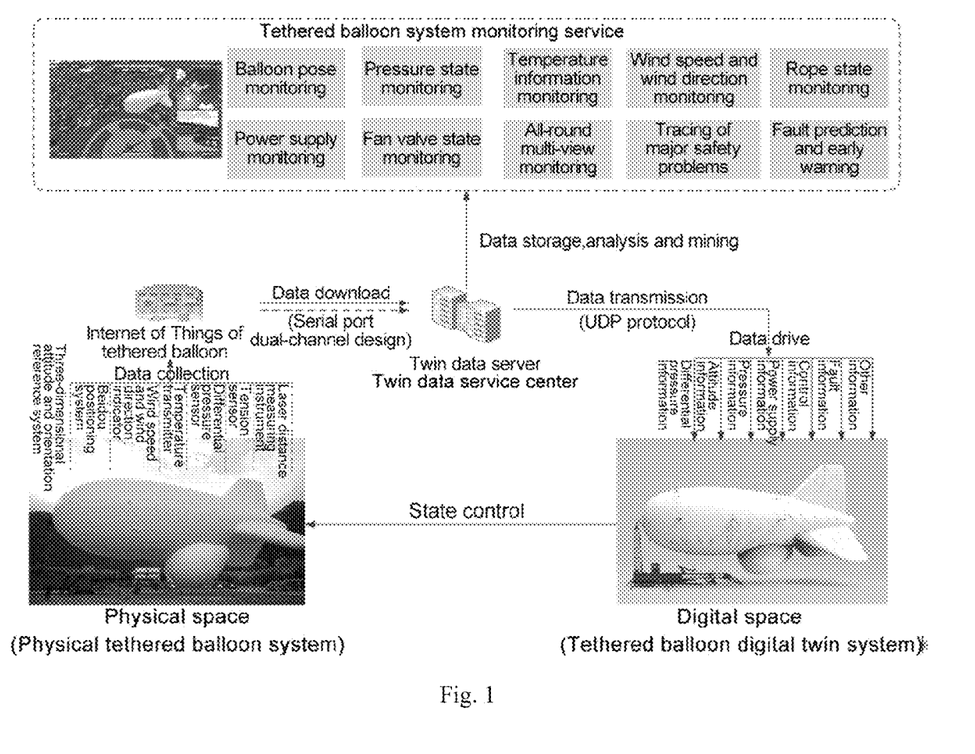
FIG. 1 is an overall solution diagram of a system according to an embodiment of the present invention.

As shown in FIG. 1, the digital twin tethered balloon system of the embodiment of the present invention includes four parts.

(1) A Physical Tethered Balloon System

The physical tethered balloon system mainly refers to an objective physical entity of the tethered balloon system and mainly includes a balloon body, a subsystem on-balloon device, a tethering rope, a ground tethering facility and a ground control device. In order to collect the data, the physical tethered balloon system further includes an Internet of Things of the tethered balloon system formed by a large number of sensor devices. At the same time, the physical tethered balloon system further includes a lot of executing mechanisms for executing control instructions.

The Internet of Things of the tethered balloon Internet of Things are connected with the sensor devices such as an air pressure measurement unit, a Beidou positioning system, a three-dimensional attitude and orientation reference system, a wind speed and wind direction indicator, a tension sensor, a temperature transmitter and the like to realize the collection of the key running state data of the tethered balloon.

The air pressure measurement unit introduces the pressure of four gasbags, i.e. a helium gasbag, an auxiliary gasbag, a tail wing and a rectifying hood through a pressure line, and the external atmospheric pressure to realize the measurement of the on-balloon static pressure, differential pressure of the helium gasbag, the differential pressure of the auxiliary gasbag, the differential pressure of the tail wing and the differential pressure of the rectifying hood. The Beidou positioning system is mainly used to measure position information such as longitude, latitude and altitude. The three-dimensional attitude and orientation reference system is used to measure the attitude information of the balloon body such as a pitch angle, a rolling angle and a course. The wind speed and wind direction indicator refers to an ultrasonic wind speed and wind direction indicator and used to measure on-balloon environmental information, including on-balloon temperature, on-balloon humidity, wind speed and wind direction. The tension sensor is mainly used to measure on-balloon tension and off-balloon tension of a main rope as well as to measure the tensile stress of the tethering rope of each stage. The temperature transmitter realizes the measurement of the on-balloon environment temperature, temperature in the helium gasbag, temperature in the rectifying hood, temperature of a helium valve, temperature of an emergency helium release valve, temperature of an auxiliary gasbag valve, temperature of a tail wing valve and temperature of a rectifying hood valve.

(2) A Twin Data Service Center

The twin data service center receives the key running state data of the tethered balloon and analyzes, stores and forwards the key running state data of the tethered balloon. The information interaction among the physical tethered balloon system, the tethered balloon digital twin system and the tethered balloon system monitoring service system is realized.

The key running state data of the tethered balloon mainly refers to the key running state data of the tethered balloon such as balloon parameter information, power supply information, working state information, fault information and emergency treatment information collected by the sensors, wherein the balloon parameter information includes the pressure of each gasbag, the gasbag and valve temperature, the external atmospheric temperature and humidity, wind speed, wind direction, balloon fullness, balloon attitude and course, balloon altitude and orientation, the on-balloon tension of the tethering rope, etc. The equipment control information includes pressure remote control/automatic control, fan control, valve control, valve heating control, anti-collision light control, tear pair control, responder control, etc. The working state information includes a working state of a system power supply, a running state of the executing mechanism such as a valve fan, and a working state of a protection room tethering device. The fault information describes a fault state of an on-balloon control system and a fault state of an on-balloon power supply system.

Along with the running of the tethered balloon system, the twin data is accumulated continuously. These data provide basic data support for the fault analysis and prediction of the tethered balloon, tracing of major safety problems and even the optimization design of the future tethered balloon system.

(3) A Tethered Balloon Digital Twin System

Figure 2:
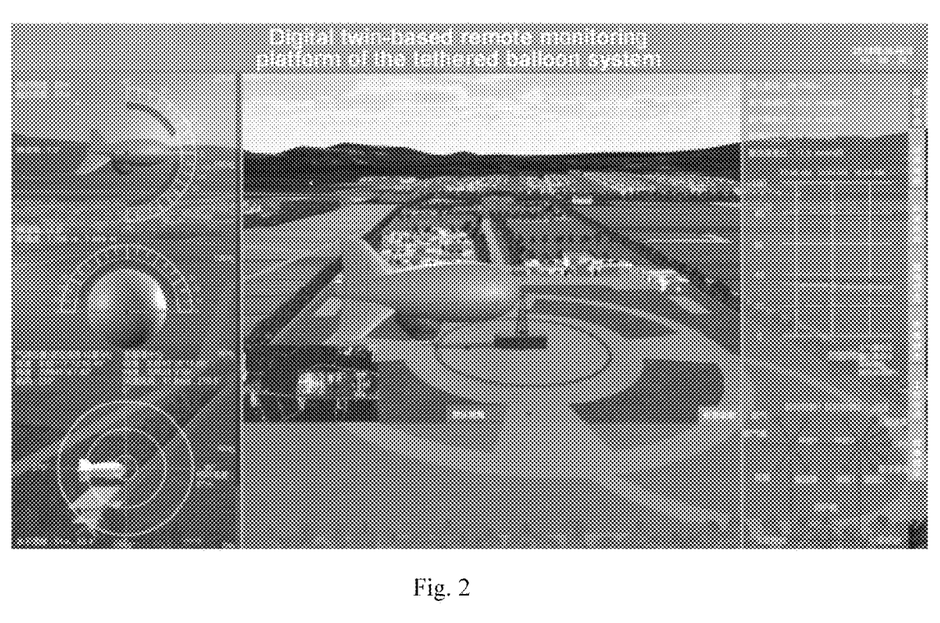
FIG. 2 is a schematic diagram of a tethered balloon digital twin system built in an embodiment of the present invention.

The tethered balloon digital twin system is a digital mirror image of the physical tethered balloon system, and drives a twin model through the key running state data of the tethered balloon to realize the pose simulation of the tethered balloon body and the movement simulation of the ground tethering facility, thereby reflecting the actual state of the physical tethered balloon system in real time. FIG. 2 shows the built tethered balloon digital twin system. The pose simulation of the balloon body refers to setting a local coordinate system position of the balloon body according to the longitude, latitude and altitude information of the tethered balloon system, and setting an Euler angle of the local coordinate system of the balloon body according to the pitch angle, the rolling angle and the course of the balloon body, thereby realizing the pose change of the tethered balloon body; and the movement simulation of the ground tethering facility refers to setting an Euler angle of the local coordinate system of the ground tethering facility according to the acquired orientation data of a protection cabin, thereby realizing the rotation of the ground tethering facility.

Figure 3:
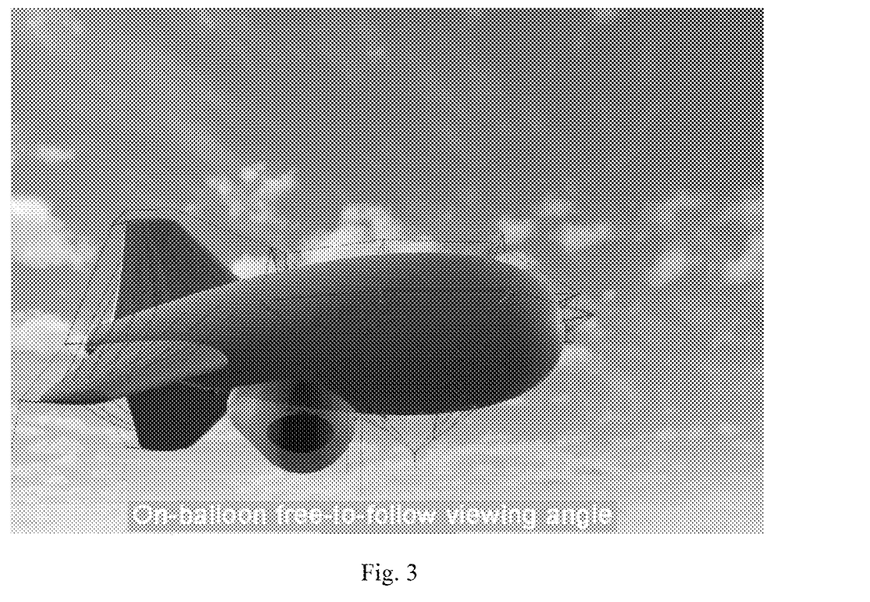
FIG. 3 is a balloon body digital twin model built in an embodiment of the present invention.
Figure 4:
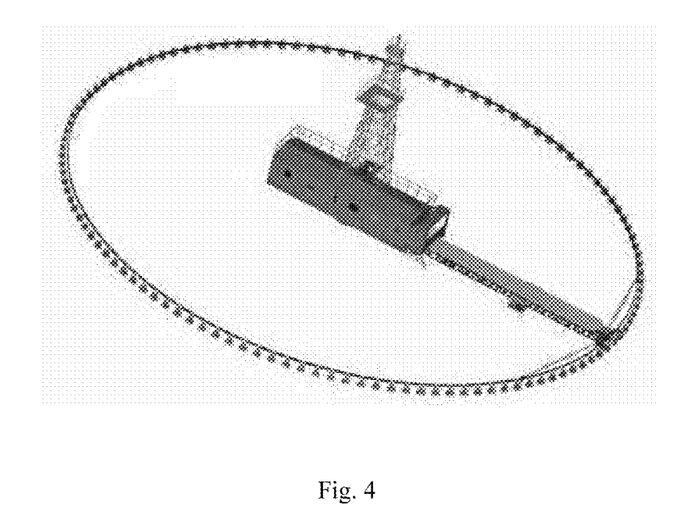
FIG. 4 is a ground tethering facility digital twin model built in an embodiment of the present invention.

The twin model mainly includes a balloon body digital twin model (including an on-balloon device model), a tethering rope digital twin model, a ground tethering facility digital twin model and a ground control center digital twin model. A building process of the balloon body digital twin model includes: a balloon body empty object is created, the local coordinate system position of the balloon body empty object is set as a coordinate of the gravity core of the balloon body (a coordinate of the gravity core of the balloon body with respect to a bottom center point of a tethering tower in a tethered state), the on-balloon device model such as a gas body model, a head cone model, a device hanger model, a rope model and the like is added to a balloon body node, so that the pose change of the balloon body can rotate around the gravity core of the balloon body. FIG. 3 shows a built balloon body digital twin model. A building process of the ground tethering facility digital twin model includes: a ground tethering facility empty object is created, a local coordinate system position of the ground tethering facility empty object is set as an origin of a global coordinate system, and rotating models of ground tethering facilities such as a tethering tower, a load bearing frame, a horizontal crossbeam, a protection room, a control room and the like are added to a ground tethering facility object node, so that the ground tethering facility can rotate around the center of the tethering tower. FIG. 4 shows the built ground tethering facility digital twin model.

(4) A Tethered Balloon Monitoring Service System

The tethered balloon monitoring service system realizes the working of a working state of the tethered balloon system, all-round multi-view monitoring, tracing of major safety problems and automatic control of the tethered balloon system.

The monitoring of the working state mainly includes balloon pose monitoring, monitoring of a pressure state, monitoring of temperature information, monitoring of wind speed and wind direction, monitoring of a rope state, monitoring of a power supply state, state control of the fan, etc.

Figure 5:
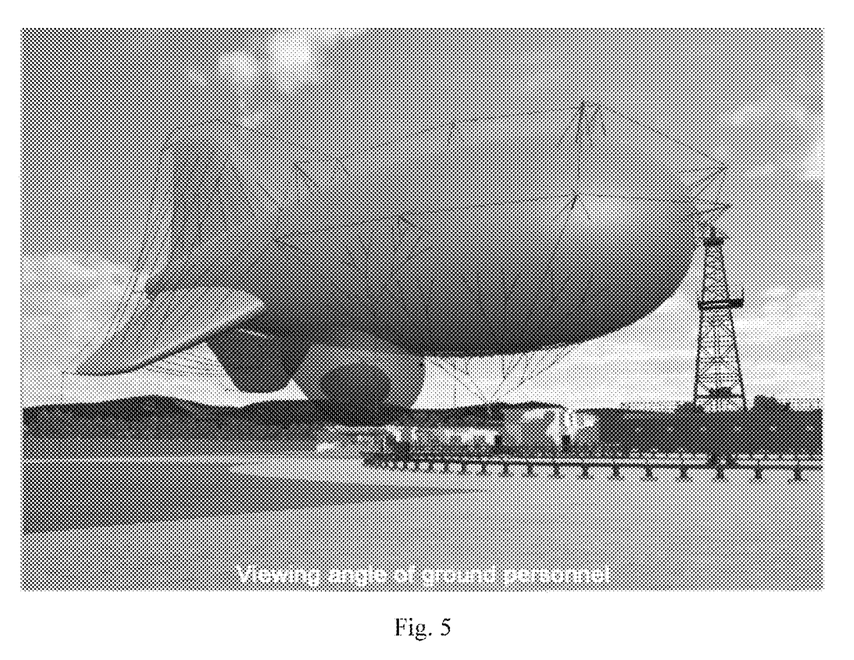
FIG. 5 is a schematic diagram of a viewing angle of ground personnel in an embodiment of the present invention.
Figure 6:
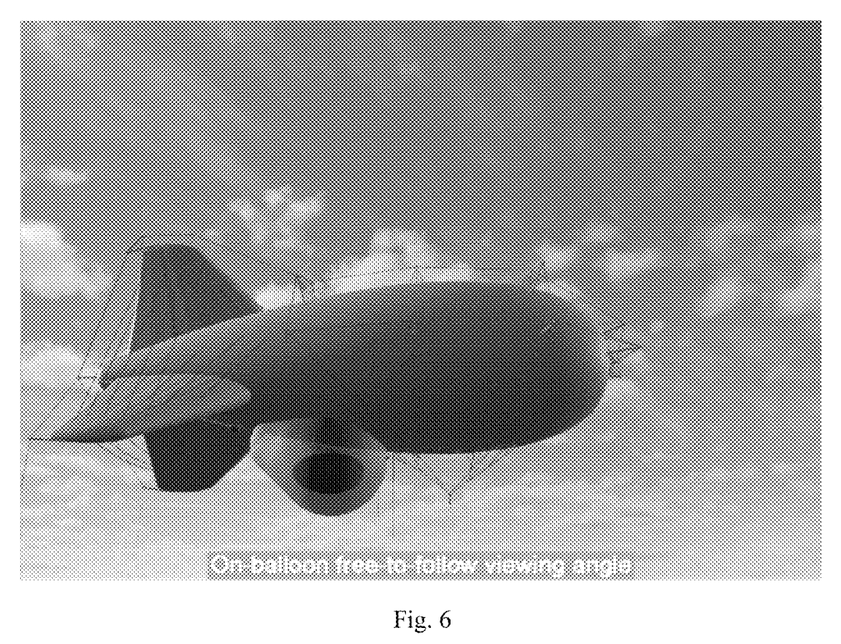
FIG. 6 is a schematic diagram of an on-balloon free-to-follow viewing angle in an embodiment of the present invention.
Figure 7:
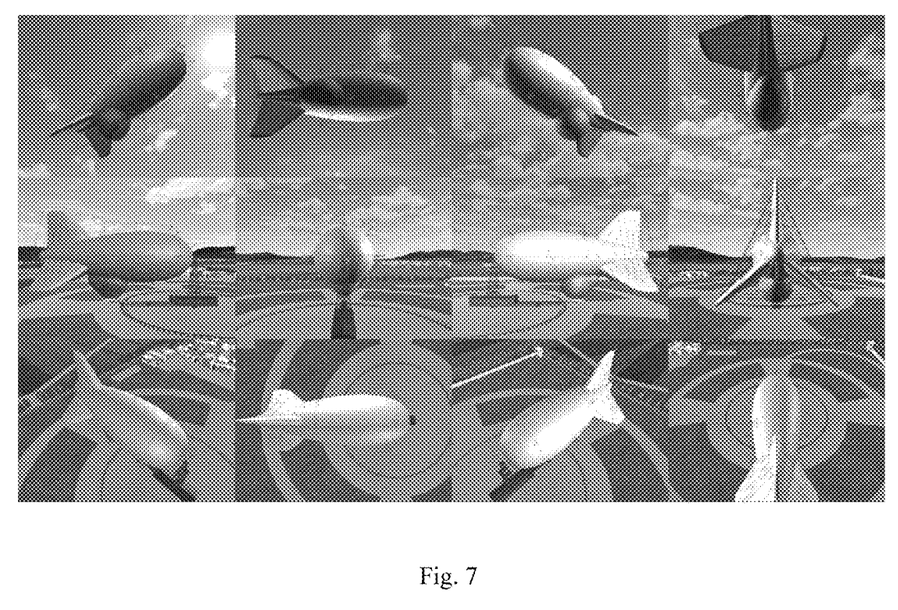
FIG. 7 is a schematic diagram of a fixed viewing angle in an embodiment of the present invention.

The all-round multi-view monitoring provides a viewing angle of ground personnel, an on-balloon free-to-follow viewing angle and a plurality of fixed viewing angles. The viewing angle of the ground personnel mainly simulates the viewing angle of the ground working personnel; the direction of the viewing angle of the ground personnel is controlled by a mouse; the viewing angle of the ground personnel may be controlled to move through a keyboard; and the viewing angle is mainly used for the ground tethering, repairing and fastening of the tethered balloon and for checking the state of the tethered balloon in a process of releasing and recycling the tethered balloon, as shown in FIG. 5. The on-balloon free-to-follow viewing angle is mainly used for checking the state of the tethered balloon when the tethered balloon is in aerial mooring, and in the process of releasing and recycling the tethered balloon. The all-round checking of the tethered balloon at any viewing angle may be realized by moving the mouse. The zooming in and out of a view port may be realized by rolling a key in the mouse, thereby checking local details of the tethered balloon system, for example, checking the working states of a fan and valves, as shown in FIG. 6. The fixed viewing angle refers to setting several fixed virtual cameras to monitor the state of the tethered balloon and is mainly used for monitoring the state of the tethered balloon when the tethered balloon is in aerial mooring and in the process of releasing and recycling the tethered balloon, as shown in FIG. 7.

The tracing of major safety problems refers to that when major safety problems occur, according to the historical running twin data of the tethered balloon, the tethered balloon digital twin system is used to realize the reappearing of a historical running process and scene of the tethered balloon system to find causes of the major safety problems.

The automatic control of the tethered balloon refers to that the pressure of each gasbag body is automatically controlled through the fan and valves; and when the pressure is excessively high, the valve is opened to release the air, and when the pressure is excessively low, the fan is started for inflation.

According to the embodiment of the present invention, firstly the Internet of Things of the tethered balloon is built and various sensor devices are deployed to collect the balloon parameter information, device control information, working state information and the like of the physical tethered balloon system in the physical space and to process various data, and the data is transmitted to the ground twin data service center through data download. The ground twin data service center receives, analyzes, stores and forwards the data and transmits the data to a ground control center and a remote monitoring center client through a User Datagram Protocol (UDP). The ground control center and a data processing module of the remote monitoring center client receive and analyze the twin data and comprehensively display various data in a digital space to drive the tethered balloon twin model to move or to perform the three-dimensional visual display; and the tethered balloon system monitoring service monitors and controls the running state of the tethered balloon and performs the all-round multi-view monitoring, so that the attitude, pressure state and power supply state of the tethered balloon and the on-off state of the fan/valve are monitored in real time for monitoring and early warning, and the state of the tethered system can be controlled according to the monitoring information.

It should be stated that the ground control center and the remote monitoring center client are installation places/carriers of the tethered balloon digital twin system. The ground control center and the remote monitoring center client are generally computers.

The traditional digital twin generally only realizes the data mapping from a physical end to a twin end. In the embodiment of the present invention, the control from the twin end to the physical end is realized through the executing mechanism.

In the embodiment of the present invention, the digital twin is applied to the running and maintenance stages of the actual running of the product. The digital twin technology is applied to the remote running and maintenance of the tethered balloon, which mainly solves the problems that the traditional tethered balloon system is low in visualization degree and weak in interaction means. Through the tethered balloon system twin model, the running state of the tethered balloon system can be displayed intuitively, so that the visualization degree is high, and the user may interactively operate the digital twin three-dimensional model. In the embodiment of the present invention, the digital twin technology is applied to the remote running and maintenance of the tethered balloon, which has the following advantages:

①The tethered balloon system model is mainly arranged by adjusting a hierarchical structure of the tethered balloon system model; and by setting the balloon body model and the local coordinate system of the ground tethering facility, the pose simulation of the balloon body and the rotation simulation of the ground tethering facility are facilitated. For example, the original local coordinate system of the balloon body is at the bottom center of the tethering tower, which is difficult to drive the balloon body for simulation directly by adopting the collected position data and attitude data (the pitch angle, the rolling angle and the course), a series of coordinate system transformation is needed, and generally, the operation of 4*4 matrices is needed, so that the process is relatively complicated. In the embodiment of the present invention, by building a new balloon body node, and setting the local coordinate system position of the balloon body node at the gravity core of the balloon body, the collected attitude data can be directly assigned to the Euler angle of the balloon body to realize the attitude simulation of the balloon body.

② For the definition of the viewing angle of the ground personnel and the on-balloon free-to-follow viewing angle, in the embodiment of the present invention, the position and the direction of the viewing angle of the ground personnel are controlled in real time according to the input of the keyboard and the mouse, and the all-round checking at any viewing angle and local detail checking of the aerial tethered balloon can be realized according to the input of the mouse.

In conclusion, compared with the prior art, the present invention has the following beneficial effects:

The embodiment of the present invention realizes the deep integration of the physical space and the digital space of the tethered balloon system, which can monitor the tethered balloon system with high visualization degree, thereby realizing the all-round multi-view monitoring of the tethered balloon, tracing of major safety problems and fault diagnosis and early warning, and ensuring the running safety of the tethered balloon system.

It should be noted that through the description of the above implementation modes, those skilled in the art can clearly understand that each implementation mode can be realized through software and a necessary general hardware platform. Based on this understanding, the above technical solution can embody the essential part or the part that contributes to the prior art in the form of a software product, and the computer software product can be stored in a computer-readable storage medium, such as ROM/RAM, magnetic disc, optical disc, etc., including several instructions to make a computer device (which may be a personal computer, a server, or a network device) execute the methods described in each embodiment or some parts of the embodiment.

Herein, relational terms such as first and second are only used to distinguish one entity or operation from another entity or operation, and do not necessarily require or imply any such existence of the actual relationship or sequence between these entities or operations. Moreover, the terms "include", "comprise" or any other variants thereof are intended to cover non-exclusive inclusion, so that a process, method, article or device including a series of elements not only includes those elements, but also includes other elements not explicitly listed, or also includes elements inherent to this process, method, article or device. Without more limitations, the elements defined by the sentence "including a . . . " do not exclude the existence of other same elements in the process, method, article or device including the elements.

The above embodiments are only used to illustrate the technical solution of the present invention, not to limit the technical solution. Although the present invention is described in detail by referring to the above embodiments, those ordinary skilled in the art shall understand that the technical solutions recorded in the embodiments can be amended, or some of the technical features are replaced equivalently. The amendments or replacements do not cause the essence of the corresponding technical solutions to deviate from the spirit and scope of the technical solutions of the embodiments of the present invention.

What is claimed is:

1. A digital twin tethered balloon system, comprising:
 a physical tethered balloon system, wherein the physical tethered balloon system is an objective physical entity of the tethered balloon system and comprises a balloon body, a subsystem on-balloon device, a tethering rope, a ground tethering facility, a ground control device, an Internet of Things of a tethered balloon system and a tethered balloon on-balloon executing mechanism; the Internet of Things of the tethered balloon system is used to collect key running state data of a tethered balloon; and the on-balloon executing mechanism is used to receive and execute a control instruction of the tethered balloon digital twin system;

a twin data service center, wherein the twin data service center receives the key running state data of the tethered balloon and analyzes, stores and forwards the key running state data of the tethered balloon;

a tethered balloon digital twin system, wherein the tethered balloon digital twin system is a digital mirror image of the physical tethered balloon system, and drives a twin model to realize a pose simulation of a tethered balloon body and movement simulation of the ground tethering facility through the key running state data of the tethered balloon forwarded by the twin data service center; and a tethered balloon monitoring service system, wherein the tethered balloon monitoring service system analyzes, processes and mines the key running state data of the twin data service center to realize the monitoring of a working state of the tethered balloon system, all-round multi-view monitoring, tracing of safety problems and automatic control of the tethered balloon system, wherein the twin model mainly comprises a balloon body digital twin model, a tethering rope digital twin model, a ground tethering facility digital twin model and a ground control center digital twin model;

a building process of the balloon body digital twin model comprises: creating a balloon body empty object, setting a local coordinate system position of the balloon body empty object as a gravity core coordinate of the balloon body, and adding an on-balloon device model to a balloon body node, so that a pose change of the balloon body can rotate around the gravity core of the balloon body;

a building process of the ground tethering facility digital twin model comprises: creating a ground tethering facility empty body, setting a local coordinate system position of the ground tethering facility empty object as an origin of a global coordinate system, and adding a model rotating with the ground tethering facility to the ground tethering facility object node, so that the ground tethering facility can rotate around the center of a tethering tower.

2. The digital twin tethered balloon system according to claim 1, wherein the key running state data of the tethered balloon comprises: balloon parameter data, power supply data, working state data, fault data and emergency data, wherein the balloon parameter data comprises pressure of each airbag, airbag temperature, valve temperature, outer atmospheric temperature and humidity, wind speed and wind direction, balloon fullness, balloon attitude and course, balloon altitude, balloon orientation and tethering rope on-balloon tensile force;

the working state data comprises a working state of a system power supply, a running state of the executing mechanism and a working state of a protection room tethering device;

the fault data comprises a fault state of an on-balloon control system and a fault state of an on-balloon power supply system.

3. The digital twin tethered balloon system according to claim 1, wherein viewing angles provided by the all-round multi-view monitoring comprise a viewing angle of ground personnel, an on-balloon free-to-follow viewing angle and a plurality of fixed viewing angles.

4. The digital twin tethered balloon system according to claim 1, wherein the tracing of safety problems comprises: when safety problems occur, according to the historical running twin data of the tethered balloon, the tethered balloon digital twin system is used to realize the reappearing of a historical running process and scene of the tethered balloon system to find causes of the safety problems.

5. The digital twin tethered balloon system according to claim 1, wherein the automatic control of the tethered balloon comprises: the pressure of each airbag body of the tethered balloon is automatically controlled through a fan and a valve; and the valve is openable to release the air to reduce the pressure, and the fan is configured for inflation to increase the pressure.

6. The digital twin tethered balloon system according to claim 1, wherein the twin data service center forwards the key running state data of the tethered balloon to the tethered balloon digital twin system in a following way: a user datagram protocol.

7. The digital twin tethered balloon system according to claim 6, wherein the key running state data of the tethered balloon comprises: balloon parameter data, power supply data, working state data, fault data and emergency data, wherein the balloon parameter data comprises pressure of each airbag, airbag temperature, valve temperature, outer atmospheric temperature and humidity, wind speed and wind direction, balloon fullness, balloon attitude and course, balloon altitude, balloon orientation and tethering rope on-balloon tensile force;

the working state data comprises a working state of a system power supply, a running state of the executing mechanism and a working state of a protection room tethering device;

the fault data comprises a fault state of an on-balloon control system and a fault state of an on-balloon power supply system.

8. The digital twin tethered balloon system according to claim 6, wherein viewing angles provided by the all-round multi-view monitoring comprise a viewing angle of ground personnel, an on-balloon free-to-follow viewing angle and a plurality of fixed viewing angles.

9. The digital twin tethered balloon system according to claim 6, wherein the tracing of safety problems comprises: when safety problems occur, according to the historical running twin data of the tethered balloon, the tethered balloon digital twin system is used to realize the reappearing of a historical running process and scene of the tethered balloon system to find causes of the safety problems.

10. The digital twin tethered balloon system according to claim 6, wherein the automatic control of the tethered balloon comprises: the pressure of each airbag body of the tethered balloon is automatically controlled through a fan and a valve; and the valve is openable to release the air to reduce the pressure, and the fan is configured for inflation to increase the pressure.

11. The digital twin tethered balloon system according to claim 1, wherein the Internet of Things of the tethered balloon is composed of sensors deployed on the tethered balloon system, comprising an air pressure measurement unit, a Beidou positioning system, a three-dimensional attitude and orientation reference system, a wind speed and wind direction indicator, a tension sensor and a temperature transmitter.

12. The digital twin tethered balloon system according to claim 11, wherein the key running state data of the tethered balloon comprises: balloon parameter data, power supply data, working state data, fault data and emergency data, wherein the balloon parameter data comprises pressure of each airbag, airbag temperature, valve temperature, outer atmospheric temperature and humidity, wind speed and wind direction, balloon fullness, balloon attitude and course, balloon altitude, balloon orientation and tethering rope on-balloon tensile force;

the working state data comprises a working state of a system power supply, a running state of the executing mechanism and a working state of a protection room tethering device;

the fault data comprises a fault state of an on-balloon control system and a fault state of an on-balloon power supply system.

13. The digital twin tethered balloon system according to claim 11, wherein viewing angles provided by the all-round multi-view monitoring comprise a viewing angle of ground personnel, an on-balloon free-to-follow viewing angle and a plurality of fixed viewing angles.

14. The digital twin tethered balloon system according to claim 11, wherein the tracing of safety problems comprises: when safety problems occur, according to the historical running twin data of the tethered balloon, the tethered balloon digital twin system is used to realize the reappearing of a historical running process and scene of the tethered balloon system to find causes of the safety problems.

15. The digital twin tethered balloon system according to claim 11, wherein the automatic control of the tethered balloon comprises: the pressure of each airbag body of the tethered balloon is automatically controlled through a fan and a valve; and the valve is openable to release the air to reduce the pressure, and the fan is configured for inflation to increase the pressure.

16. The digital twin tethered balloon system according to claim 1, wherein the pose simulation of the tethered balloon body comprises:

a local coordinate system position of the balloon body is set according to longitude, latitude and altitude information of the tethered balloon system to realize the position change of the tethered balloon body; and an Euler angle of the local coordinate system of the balloon body is set according to a pitch angle, a rolling angle and a course of the balloon body to realize the pose change of the tethered balloon body;

the movement simulation of the ground tethering facility comprises:

an Euler angle of the local coordinate system of the ground tethering facility is set according to orientation data of a protection cabin to realize the rotation change of the ground tethering facility.

17. The digital twin tethered balloon system according to claim 16, wherein the key running state data of the tethered balloon comprises: balloon parameter data, power supply data, working state data, fault data and emergency data, wherein the balloon parameter data comprises pressure of each airbag, airbag temperature, valve temperature, outer atmospheric temperature and humidity, wind speed and wind direction, balloon fullness, balloon attitude and course, balloon altitude, balloon orientation and tethering rope on-balloon tensile force;

the working state data comprises a working state of a system power supply, a running state of the executing mechanism and a working state of a protection room tethering device;

the fault data comprises a fault state of an on-balloon control system and a fault state of an on-balloon power supply system.

18. The digital twin tethered balloon system according to claim 16, wherein viewing angles provided by the all-round multi-view monitoring comprise a viewing angle of ground personnel, an on-balloon free-to-follow viewing angle and a plurality of fixed viewing angles.

19. The digital twin tethered balloon system according to claim 16, wherein the tracing of safety problems comprises: when safety problems occur, according to the historical running twin data of the tethered balloon, the tethered balloon digital twin system is used to realize the reappearing of a historical running process and scene of the tethered balloon system to find causes of the safety problems.

20. The digital twin tethered balloon system according to claim 16, wherein the automatic control of the tethered balloon comprises: the pressure of each airbag body of the tethered balloon is automatically controlled through a fan and a valve; and the valve is openable to release the air to reduce the pressure, and the fan is configured for inflation to increase the pressure.

* * * * *